United States Patent
Dyer et al.

(10) Patent No.: US 7,569,489 B2
(45) Date of Patent: Aug. 4, 2009

(54) HIGH PERFORMANCE 3D FET STRUCTURES, AND METHODS FOR FORMING THE SAME USING PREFERENTIAL CRYSTALLOGRAPHIC ETCHING

(75) Inventors: Thomas W. Dyer, Pleasant Valley, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/851,464

(22) Filed: Sep. 7, 2007

(65) Prior Publication Data

US 2007/0298552 A1 Dec. 27, 2007

Related U.S. Application Data

(62) Division of application No. 11/380,692, filed on Apr. 28, 2006.

(51) Int. Cl.
*H01L 21/302* (2006.01)
(52) U.S. Cl. .................. 438/735; 438/704; 438/212; 257/E21.632
(58) Field of Classification Search .......... 438/704, 438/734, 735, 156, 173, 192, 206, 212; 216/57
See application file for complete search history.

(56) References Cited

U.S. PATENT DOCUMENTS

| | | | |
|---|---|---|---|
| 5,439,723 A | 8/1995 | Miyashita et al. | |
| 5,475,280 A * | 12/1995 | Jones et al. | 313/309 |
| 6,358,867 B1 | 3/2002 | Tews et al. | |
| 6,835,246 B2 | 12/2004 | Zaidi | |
| 6,864,520 B2 * | 3/2005 | Fischetti et al. | 257/255 |
| 7,005,366 B2 | 2/2006 | Chau et al. | |

(Continued)

FOREIGN PATENT DOCUMENTS

| JP | 06005483 | 1/1994 |
|---|---|---|
| JP | 2005-317572 | * 11/2005 |

OTHER PUBLICATIONS

Yang, et al., "5 nm-Gate Nanowire FinFET", VLSI Technology, 2004, Digest of Technical Papers, 2004 Symposium on Jun. 15-17, 2004, pp. 196-197.

*Primary Examiner*—Alexander G Ghyka
*Assistant Examiner*—Reema Patel
(74) *Attorney, Agent, or Firm*—Scully, Scott, Murphy & Presser, P.C.; Joseph P. Abate, Esq.

(57) ABSTRACT

The present invention relates to high performance three-dimensional (3D) field effect transistors (FETs). Specifically, a 3D semiconductor structure having a bottom surface oriented along one of a first set of equivalent crystal planes and multiple additional surfaces oriented along a second, different set of equivalent crystal planes can be used to form a high performance 3D FET with carrier channels oriented along the second, different set of equivalent crystal planes. More importantly, such a 3D semiconductor structure can be readily formed over the same substrate with an additional 3D semiconductor structure having a bottom surface and multiple additional surfaces all oriented along the first set of equivalent crystal planes. The additional 3D semiconductor structure can be used to form an additional 3D FET, which is complementary to the above-described 3D FET and has carrier channels oriented along the first set of equivalent crystal planes.

14 Claims, 10 Drawing Sheets

U.S. PATENT DOCUMENTS

2001/0023986 A1  9/2001  Mancevski
2004/0105810 A1  6/2004  Ren et al.
2004/0174407 A1  9/2004  Hayakawa et al.
2005/0023529 A1  2/2005  Forbes
2005/0280121 A1  12/2005  Doris et al.

* cited by examiner

HIGH PERFORMANCE 3D FET STRUCTURES, AND METHODS FOR FORMING THE SAME USING PREFERENTIAL CRYSTALLOGRAPHIC ETCHING

RELATED APPLICATIONS

This application is a divisional of U.S. application Ser. No. 11/380,692, filed May 28, 2006.

FIELD OF THE INVENTION

The present invention relates to semiconductor devices that can be used in complementary metal-oxide-semiconductor (CMOS) circuits. More specifically, the present invention relates to three-dimensional (3D) field effect transistors (FETs) that are located over the same substrate and have hybrid channel orientations, i.e., the channels of such 3D FETs are oriented along different sets of semiconductor crystal planes for enhancing carrier mobility in the respective 3D FETs, as well as to methods of forming such 3D FETs by preferential crystallographic etching.

BACKGROUND OF THE INVENTION

Three-dimensional semiconductor devices, such as finFETs and tri-gate FETs, have significant performance advantages over conventional planar devices, which include, but are not limited to: better gate control over the channel and less intrinsic gate delay.

However, as the 3D semiconductor devices scale down, the device performance becomes more difficult to improve due to mobility degradation. Carrier mobility is considerably dependent on the channel surface orientation. Specifically, when the channel region is formed of single crystal silicon with the channel surfaces oriented along the {100} crystal planes of silicon, electron mobility is enhanced, but hole mobility is degraded. Alternatively, when the channel region is formed of single crystal silicon with the channel surfaces oriented along the {110} crystal planes of silicon, hole mobility is enhanced, but electron mobility is degraded.

As can be deduced from the above, the {110} silicon surfaces are therefore optimal for forming 3D p-channel FET devices (p-FETs) due to the excellent hole mobility along the {110} planes, which leads to higher drive currents in the 3D p-FETs. However, such surfaces are completely inappropriate for forming 3D n-channel FET devices (n-FETs). The {100} silicon surfaces instead are optimal for forming 3D n-FET devices due to the enhanced electron mobility along the {100} planes, which results in higher drive currents in the 3D n-FETs.

In view of the above, there is a need for providing 3D semiconductor device structures that are located over the same substrate but have different surface orientations (i.e., hybrid surface orientations), which provide optimal carrier mobility in respective 3D FET devices.

A need also exists to provide a method to form an integrated semiconductor device that comprises complementary 3D FETs with hybrid channel orientations, i.e., including 3D n-FETs with channels oriented along a first set of equivalent crystal planes that provide relatively higher electron mobility, and 3D p-FETs with channels oriented along a second, different set of equivalent crystal planes that provide relatively higher hole mobility.

SUMMARY OF THE INVENTION

In one aspect, the present invention provides a semiconductor device comprising a substrate with a 3D semiconductor structure located thereover. The 3D semiconductor structure has a bottom surface in direct contact with an upper surface of the substrate and multiple additional surfaces not in contact with the substrate. The bottom surface of the 3D semiconductor structure is oriented along one of a first set of equivalent crystal planes, while the additional surfaces of the 3D semiconductor structure are oriented along a second, different set of equivalent crystal planes.

The term "3D" as used herein refers to a structure having a thickness or height that is comparable to its width and length, i.e., the thickness or height of such a structure is not less than 10% of either the width or the length, whichever is larger.

The term "equivalent crystal planes" as used in the present invention refers to a family of equivalent crystal planes or facets as defined by the Miller Indexes, which will be described in greater detail hereinbelow.

Preferably, the substrate comprises at least a base semiconductor substrate layer with an insulator layer located thereover. The 3D semiconductor structure of the present invention may have a cross-section that is triangular, pentagonal, or the like. The 3D semiconductor structure may comprise any suitable single crystal semiconductor material. When it comprises single crystal silicon, the first and second sets of equivalent crystal planes are preferably, but not necessarily, selected from the group consisting of {100}, {110}, and {111} planes of silicon.

In another aspect, the present invention relates to a 3D field effect transistor (FET), which comprises a source region, a drain region, a channel region and a gate stack. The source, drain and channel regions are located in a 3D semiconductor structure that is located over a substrate and has a bottom surface and multiple additional surfaces. The bottom surface of the 3D semiconductor structure is oriented along one of a first set of equivalent crystal planes, while the additional surfaces of the 3D semiconductor structure are oriented along a second, different set of equivalent crystal planes. The gate stack is located over the channel region and thereby defines carrier channels for the 3D FET along the additional surfaces of the 3D semiconductor structure.

In a further aspect, the present invention relates to a semiconductor device comprising first and second 3D FETs located over a substrate and each comprising a source region, a drain region, a channel region and a gate stack. The first 3D FET has a first conductivity type and the second 3D FET has a second, opposite conductivity type. The source, drain and channel regions of the first 3D FET are located in a first 3D semiconductor structure having a bottom surface and multiple additional surfaces. The bottom surface of the first 3D semiconductor structure is oriented along one of a first set of equivalent crystal planes, while the additional surfaces of the first 3D semiconductor structure are oriented along a second, different set of equivalent crystal planes. Further, the gate stack of the first 3D FET is located over the channel region thereof and thereby defines carrier channels for the first 3D FET along the additional surfaces of the first 3D semiconductor structure, The source, drain and channel regions of the second 3D FET are located in a second 3D semiconductor structure having a bottom surface and multiple additional surfaces, all orientated along the first set of equivalent crystal planes. Further, the gate stack of the second 3D FET is located over the channel region thereof and thereby defines carrier channels for the second 3D FET along the additional surfaces of the second 3D semiconductor structure.

The first 3D semiconductor structure may have a triangular or pentagonal cross-section, and the second 3D semiconductor structure may have a rectangular cross-section. Further, when the first and second 3D semiconductor structures both comprise single crystal silicon, the first and second sets of equivalent crystal planes are selected from the group consisting of the {100}, {110}, and {111} planes of silicon.

In a specific embodiment of the present invention, the first 3D PET has p-type conductivity and the second 3D FET has n-type conductivity. In this manner, when the first and second 3D semiconductor structures both comprise single crystal silicon, the first set of equivalent crystal planes are preferably the {100} planes of silicon, and the second, different set of equivalent crystal planes are preferably the {110} planes of silicon.

In an alternative embodiment of the present invention, the first 3D FET has n-type conductivity and the second 3D FET has p-type conductivity. In this manner, when the first and second 3D semiconductor structures both comprise single crystal silicon, the first set of equivalent crystal planes are preferably the {110} planes of silicon, and the second, different set of equivalent crystal planes are preferably the {100} planes of silicon.

In a still further aspect, the present invention relates to a method for forming a semiconductor device, comprising:

forming a layered substrate comprising at least a base semiconductor substrate layer, an insulator layer over the base semiconductor substrate layer, and a semiconductor device layer over the insulator layer, wherein the semiconductor device layer has upper and lower surfaces oriented along a first set of equivalent crystal planes;

patterning the semiconductor device layer to form one or more 3D precursory semiconductor structures; and conducting preferential crystallographic etching of at least one of the 3D precursory semiconductor structures, wherein the at least one 3D precursory semiconductor structure is etched along the first set of equivalent crystal planes at a rate faster than that along a second, different set of equivalent crystal planes, thereby forming a first 3D semiconductor structure having a bottom surface and multiple additional surfaces, wherein the bottom surface of the first 3D semiconductor structure is oriented along one of the first set of equivalent crystal planes, and wherein the multiple additional surfaces of the first 3D semiconductor structure are oriented along the second, different set of equivalent crystal planes.

Preferably, but not necessarily, the semiconductor device layer is patterned by anisotropic etching that etches the semiconductor device layer along a direction that is perpendicular to its upper surface. The one or more 3D precursory semiconductor structures formed by the anisotropic etching each has a rectangular cross-section.

The anisotropic etching and the preferential crystallographic etching can be carried out using either wet etching techniques or dry etching techniques, or a combination of both. Preferably, but not necessarily, the anisotropic etching is carried out using a dry-etching step, and the preferential crystallographic etching is carried out using a wet-etching step. More preferably, reactive ions are used in the dry-etching step, while a hydroxide-based etching solution is used in the wet-etching step.

In one specific embodiment of the present invention, the first 3D semiconductor structure formed by the preferential crystallographic etching has a triangular cross-section. In an alternative embodiment of the present invention, the at least one 3D precursory semiconductor structure is treated by hydrogen annealing before the preferential crystallographic etching, and wherein the first 3D semiconductor structure formed by the preferential crystallographic etching correspondingly has a pentagonal cross-section.

The above-described first 3D FET can be used to form a first 3D FET. Specifically, a gate stack can be formed over at least a portion of the first 3D semiconductor structure, thereby defining a channel region for the first 3D FET, which is located under the gate stack, and a source region and a drain region also located in the first 3D semiconductor structure but at two sides of the channel region.

In a particularly preferred embodiment of the present invention, the method as described hereinabove is used to form at least two 3D semiconductor structures with hybrid surface orientations. Specifically, the semiconductor device layer is patterned into at least two 3D precursory semiconductor structures, one being masked and the other being exposed during subsequent preferential crystallographic etching. The exposed 3D precursory semiconductor structure is preferentially etched to form the first 3D semiconductor structure, while the masked 3D precursory semiconductor is not etched and thereby forms a second 3D semiconductor structure having a bottom surface and multiple additional surfaces all oriented along the first set of equivalent crystal planes. In this manner, the first 3D semiconductor structure can be used to form a first 3D FET having a first conductivity type and with carrier channels oriented along the second, different set of equivalent crystal planes, and wherein the second 3D semiconductor structure can be used to form a second 3D FET having a second conductivity type and with carrier channels oriented along the first set of equivalent crystal planes.

Other aspects, features and advantages of the invention will be more filly apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides 3D semiconductor structures that can be formed over the same substrate with hybrid surface orientations, i.e., the 3D semiconductor structures have surfaces oriented along different sets of semiconductor crystal planes and can therefore be used for forming complementary 3D FET devices with hybrid channel orientations.

Figure 1:
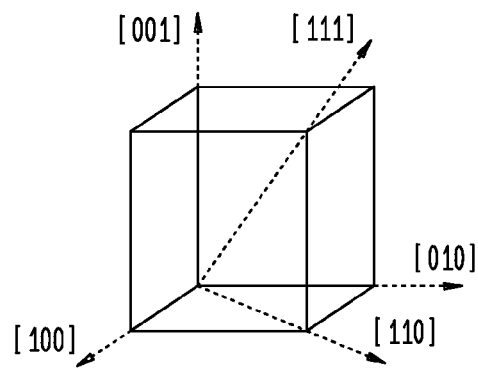
FIG. 1 shows a silicon crystal unit cell with certain crystal orientations specifically indicated by arrowheads.
Figure 2:
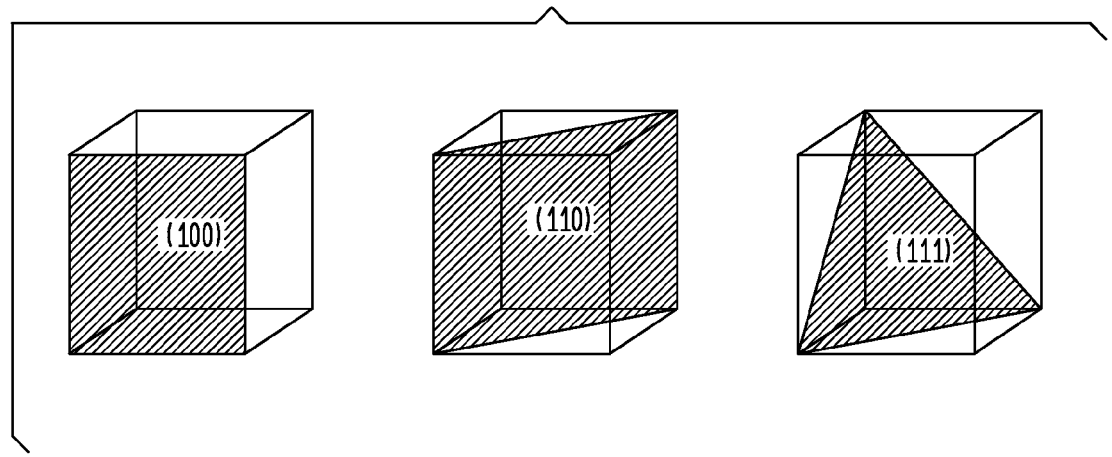
FIG. 2 shows certain specific crystal planes in silicon crystal unit cells.

In single crystal semiconductor materials, all lattice directions and lattice planes in a unit cell of a single crystal material can be described by a mathematical description known as a Miller Index. Specifically, the notation [hkl] in the Miller Index defines a crystal direction or orientation. FIG. 1 shows a single crystal silicon unit cell, which is a cubic cell. Certain crystal directions, such as [001], [100], [010], [110], and [111], are specifically indicated by arrowheads in the cubic unit cell. Moreover, the crystal planes or facets of a single crystal silicon unit cell are defined by the notation (hkl) in Miller Index, which refers to a particular crystal plane or facet that is perpendicular to the [hkl] direction. FIG. 2 illustratively shows the crystal planes (100), (110), and (111) of the single crystal silicon unit cells, which are respectively perpendicular to the [100], [110], and [111] directions.

Further, because the unit cells are periodic in a semiconductor crystal, there exist families or sets of equivalent crystal directions and planes. The notation <hkl> in the Miller Index therefore defines a family or set of equivalent crystal directions or orientations. For example, the <100> directions include the equivalent crystal directions of [100], [010], and [001]; the <110> directions include the equivalent crystal directions of [110], [011], [101], [-1-10], [0-1-1], [-10-1], [-110], [0-11], [-101], [1-10], [01-1], and [10-1]; and the <111> directions include the equivalent crystal directions of [111], [-111], [1-11], and [11-1]. Similarly, the notation {hkl} defines a family or set of equivalent crystal planes or facets that are respectively perpendicular to the <hkl> directions. For example, the {100} planes include the set of equivalent crystal planes that are respectively perpendicular to the <100> directions.

The 3D semiconductor structures of the present invention may comprise any single crystal semiconductor material, which includes, but is not limited to: Si, SiC, SiGe, SiGeC, Ge alloys, GaAs, InAs, InP, as well as other III-V or II-VI compound semiconductors. In a preferred, but not necessary, embodiment of the present invention, the 3D semiconductor structures comprise single crystal silicon. The surfaces of some of the 3D semiconductor structure are oriented along a first set of equivalent crystal planes selected from the {100}, {110} or {111} planes of silicon, while the surfaces of others are oriented along a second, different set of equivalent crystal planes selected from the {100}, {110} or {111} planes. In this manner, the 3D semiconductor structures with hybrid surface orientations can be used for fabricating a CMOS circuit that comprises n-FETs with channels oriented along the first set of equivalent crystal planes and p-FETs with channels oriented along the second, different set of equivalent crystal planes. Consequently, carrier mobility in both the n-FETs and the p-FETs can be optimized.

Any other suitable combination of surface orientations can also be provided in the 3D semiconductor structures of the present invention. For example, other suitable crystal planes, such as the {211}, {311}, {511}, and {711} planes of single crystal silicon, can also be used in any suitable combination for defining the surface orientations of the 3D semiconductor structures of the present invention. Moreover, other single crystal semiconductor substrate materials with non-cubic unit cells, such as single crystal gallium nitride having hexagonal unit cells, can also be used for fabricating the 3D semiconductor structures of the present invention, as long as such other single crystal semiconductor materials contain different sets of crystal planes that have different carrier mobility values.

Figure 3:
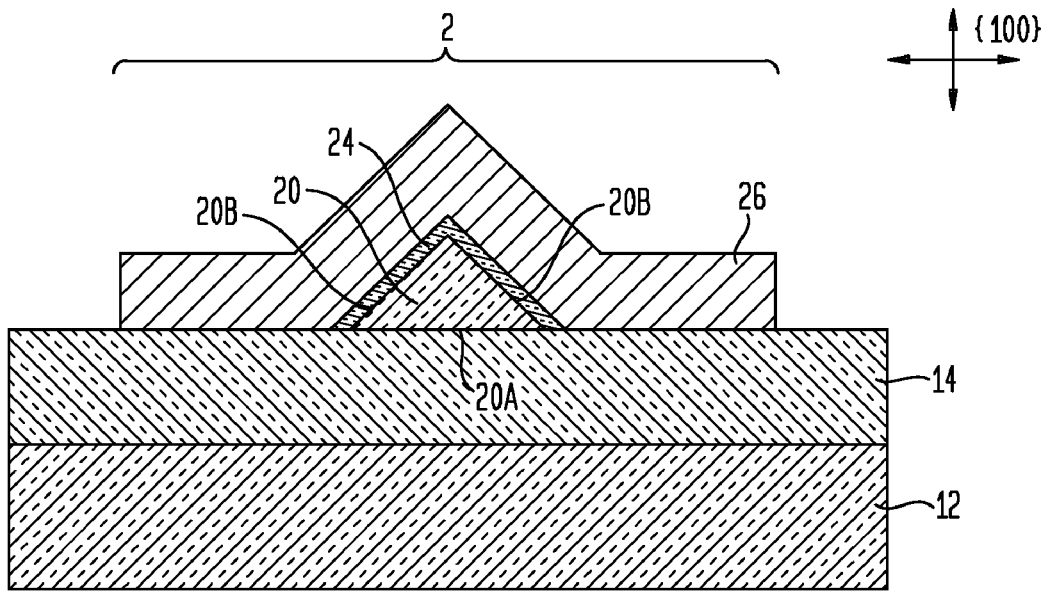
FIG. 3 shows a cross-sectional view of a 3D FET device 2 formed by a 3D semiconductor structure having a triangular cross-section, according to one embodiment of the present invention.

FIG. 3 specifically shows a cross-sectional view of a 3D FET device 2 located on a substrate and having source, drain and channel regions (not shown) all contained in a 3D semiconductor structure 20 with a triangular cross-section, according to one specific embodiment of the present invention.

The 3D semiconductor structure 20 is directly located over a substrate that comprises a base semiconductor substrate layer 12 and an insulator layer 14.

The base semiconductor substrate layer 12 may comprise any suitable semiconductor material, which includes, but is not limited to: Si, SiC, SiGe, SiGeC, Ge alloys, GaAs, InAs, InP, as well as other III-V or II-VI compound semiconductors, either in their single crystalline or polycrystalline form. The base semiconductor substrate layer 12 may also comprise an organic semiconductor or a layered semiconductor such as Si/SiGe, a silicon-on-insulator (SOD or a SiGe-on-insulator (SGOI). Preferably, the base semiconductor substrate layer 12 is composed of a Si-containing semiconductor material, i.e., a semiconductor material that includes silicon. More preferably, the base semiconductor substrate layer 12 consists essentially of bulk single crystal silicon. Alternatively, the base semiconductor substrate layer 12 may comprise one or more buried insulator layers (not shown). The base semiconductor substrate layer 12 may be doped, undoped or contain both doped and undoped regions (not shown) therein.

The insulator layer 14 may comprise any suitable insulator material(s), and it typically comprises an oxide, a nitride, or an oxynitride in either a crystalline phase or a non-crystalline phase. The physical thickness of the insulator layer 14 typically ranges from about 10 nm to about 400 nm, and more typically from about 20 nm to about 200 nm.

The 3D semiconductor structure 20 may comprise any single crystal semiconductor material, which includes, but is not limited to: Si, SiC, SiGe, SiGeC, Ge alloys, GaAs, InAs, InP, as well as other III-V or II-VI compound semiconductors. Preferably, the 3D semiconductor structure 20 is composed of a Si-containing semiconductor material, i.e., a semiconductor material that includes silicon. More preferably, the 3D semiconductor structure 20 consists essentially of single crystal silicon.

The 3D semiconductor structure 20 comprises a bottom surface 20A that is in direct contact with an upper surface of the insulator layer 14, and it further comprises multiple additional surfaces 20B that are not in contact with the insulator layer 14. The bottom surface 20A of the 3D semiconductor structure 20 is oriented along one of a first set of equivalent crystal planes, and the additional surfaces 20B are oriented along a second, different set of equivalent crystal planes.

In the specific embodiment illustrated by FIG. 3, the 3D semiconductor structure 20 comprises single crystal silicon, the bottom surface 20A of the 3D semiconductor structure 20 is oriented along one of the {100} surfaces of silicon (which indicated by the arrowheads in the upper right hand corner of FIG. 3), and the additional surfaces 20B are oriented along the {110} surfaces of silicon (which offsets from the {100} surfaces by a 45° angle). Alternatively, the bottom surface 20A of the 3D semiconductor structure 20 can be oriented along one of the {110} surfaces of silicon, while the additional surfaces 20B are oriented along the {100} surfaces of silicon. Further, the bottom surface of 20A of the 3D semiconductor structure 20 can be oriented along one of the {111} surfaces of silicon, while the additional surfaces 20B are oriented along the {100} or {110} surfaces of silicon, and vice versa. As mentioned hereinabove, any other suitable combination of surface orientations can be provided for the bottom surface 20A and the additional surfaces 20B of the 3D semiconductor structure 20.

A gate stack comprising a gate dielectric 24 and a gate conductor 26 is located over a portion of the 3D semiconductor structure 20. The gate stack thereby delineates an FET channel region (not shown) in the 3D semiconductor structure 20. Specifically, the FET channel region is located directly underneath the gate stack and between a source region (not shown) and a drain region (not shown) that are also located in the 3D semiconductor structure 20.

A gate dielectric 24 may be comprised of any suitable insulating material, including, but not limited to: oxides, nitrides, oxynitrides and/or silicates (including metal silicates and nitrided metal silicates). In one embodiment, it is preferred that the gate dielectric 24 is comprised of a high-k oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric 24 may vary, but typically, the gate dielectric layer 24 has a thickness from about 0.5 to about 10 nm, with a thickness from about 1 to about 5 nm being more typical.

The gate conductor 26 may comprises any suitable conductive materials, such as metals, metal alloys, metal suicides, metal nitrides, and doped silicon-containing semiconductor materials (such as polysilicon, SiGe, etc.), and it may have a layer thickness ranging from about 50 nm to about 150 nm, and more typically from about 80 nm to about 120 nm.

In this manner, a complete 3D FET device structure 2 is formed, and carrier channels of such a 3D FET 2 are located in the channel region (not shown) in the 3D semiconductor structure 20 directly underneath the gate stack. More specifically, the carrier channels lie on the additional surfaces 20B of the 3D semiconductor structure 20 and therefore are oriented along the {110} crystal planes of silicon, as shown in FIG. 3. Such channel orientations are particularly suitable for enhancing hole mobility, and the 3D FET device structure 2 can therefore be implanted with p-type source/drain dopant species to form a high performance 3D p-FET structure.

One or more isolation regions (not shown) can further be provided to isolate the p-FET device region from adjacent device region. Tie isolation region maybe a trench isolation region (as shown) or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

Figure 4:
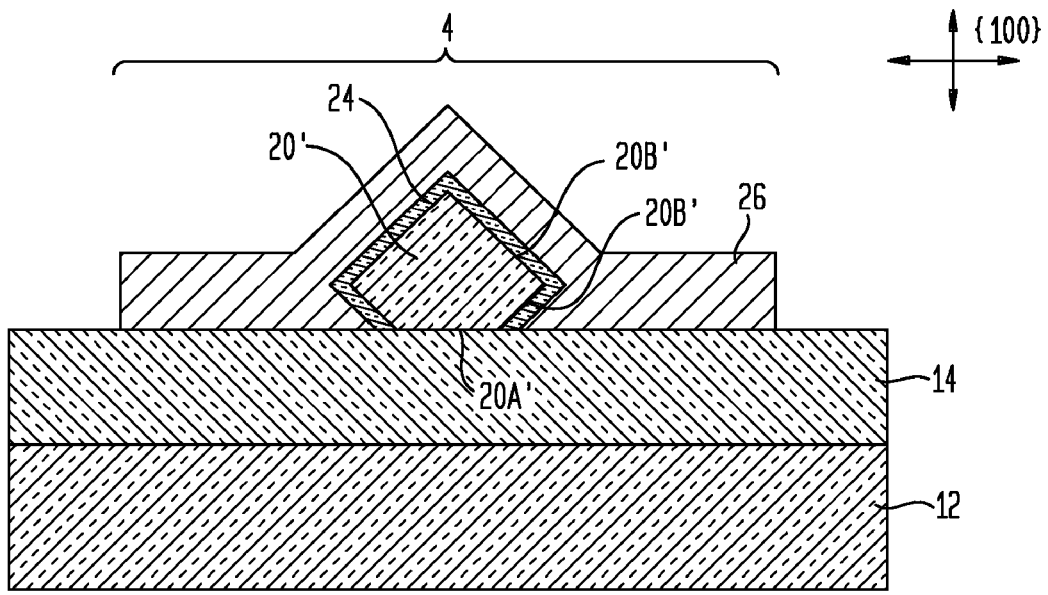
FIG. 4 shows a cross-sectional view of a 3D FET device 4 formed by a 3D semiconductor structure having a pentagonal cross-section, according to one embodiment of the present invention.

FIG. 4 shows a cross-sectional view of another 3D FET device 4 that is formed according to another specific embodiment of the present invention, which is similar to, but slightly different from, the embodiment illustrated by FIG. 3. Specifically, the 3D FET device 4 has source, drain and channel regions (not shown) all contained in a 3D semiconductor structure 20' with a pentagonal (instead of a triangular) cross-section.

The 3D semiconductor structure 20' also comprises a bottom surface 20A' that is in direct contact with an upper surface of the insulator layer 14, and it further comprises multiple additional surfaces 20B' that are not in contact with the insulator layer 14. The bottom surface 20A' of the 3D semiconductor structure 20' is oriented along one of a first set of equivalent crystal planes, and the additional surfaces 20B' are oriented along a second, different set of equivalent crystal planes. In the specific embodiment illustrated by FIG. 4, the 3D semiconductor structure 20' comprises single crystal silicon, the bottom surface 20A' of the 3D semiconductor structure 20' is oriented along one of the {100} surfaces of silicon (which indicated by the arrowheads in the upper right hand corner of FIG. 4), and the additional surfaces 20B' are oriented along the {110} surfaces of silicon (which offsets from the {100} surfaces by a 45° angle). Further, it is readily understood that any other suitable combination of surface orientations can be provided for the bottom surface 20A' and the additional surfaces 20B' of the 3D semiconductor structure 20', as mentioned hereinabove.

The gate stack comprising the gate dielectric 24 and the gate conductor 26 is located over a portion of the 3D semiconductor structure 20' in FIG. 4. The gate stack thereby delineates an FET channel region (not shown) in the 3D semiconductor structure 20'. Specifically, the FET channel region is located directly underneath the gate stack and between a source region (not shown) and a drain region (not shown) that are also located in the 3D semiconductor structure 20'. In this manner, a complete 3D FET device structure 4 is formed, and carrier channels of such a 3D FET 4 are located in the channel region (not shown) in the 3D semiconductor structure 20' directly underneath the gate stack. More specifically, the carrier channels lie on the additional surfaces 20B' of the 3D semiconductor structure 20' and therefore are oriented along the {110} crystal planes of silicon, as shown in FIG. 4. Correspondingly, and the 3D FET device structure 4 can also be readily implanted with p-type source/drain dopant species to form a high performance 3D p-FET structure.

Note that while FIGS. 3-4 illustratively demonstrate exemplary 3D FET device structures according to specific embodiments of the present invention, it is clear that a person ordinarily skilled in the art can readily modify such device structures for adaptation to specific application requirements, consistent with the above descriptions. For example, while the {110} and {100} crystal planes of single crystal silicon are primarily illustrated by FIGS. 3-4 for defining the surface orientations of the 3D semiconductor structures 20 and 20', other suitable crystal planes can also be used in any suitable combination for defining the surface orientations of the 3D semiconductor structures 20 and 20'. Further, while FIGS. 3-4 show 3D semiconductor structures 20 and 20' with specific cross-sectional shapes, i.e., triangular and pentagonal, it is well understood that 3D semiconductor structures with other cross-sectional shapes can be readily used in the present invention, as long as such 3D semiconductor structures each has a bottom surface in contact with the substrate and multiple additional surfaces not in contact with the substrate and as along as the bottom surface and the additional surfaces of such 3D semiconductor structures are aligned along different sets of equivalent crystal planes. A person ordinarily skilled in the art can readily modify the device structures illustrated in FIGS. 3-4 for adaptation to other substrate structures, crystal orientations or semiconductor materials, consistent with the spirit and principles of the present invention.

The 3D semiconductor structures of the present invention, as described hereinabove, can be readily formed by preferential crystallographic etching steps.

Specifically, exemplary processing steps for fabricating the 3D FET device 2 of FIG. 3 are illustrated hereinafter by FIGS. 5-9B. A semiconductor substrate 10 is first provided, which preferably comprises a base semiconductor substrate 12, an insulator layer 14, and a semiconductor device layer 16. The semiconductor device layer 16 may comprise any single crystal semiconductor material, which includes, but is not limited to: Si, SiC, SiGe, SiGeC, Ge alloys, GaAs, InAs, InP, as well as other III-V or II-VI compound semiconductors, and it may have upper and lower surfaces 16A and 16B oriented along one of a specific set of equivalent crystal planes, including, but not limited to: {100}, {110}, and {111} planes of silicon. In the specific embodiment shown in FIG. 5, the semiconductor device layer 16 comprises single crystal silicon and has upper and lower surfaces 16A and 16B oriented along the {100} planes of silicon (which are indicated by the arrowheads in the upper-right-hand corner of FIG. 5).

Figure 6:
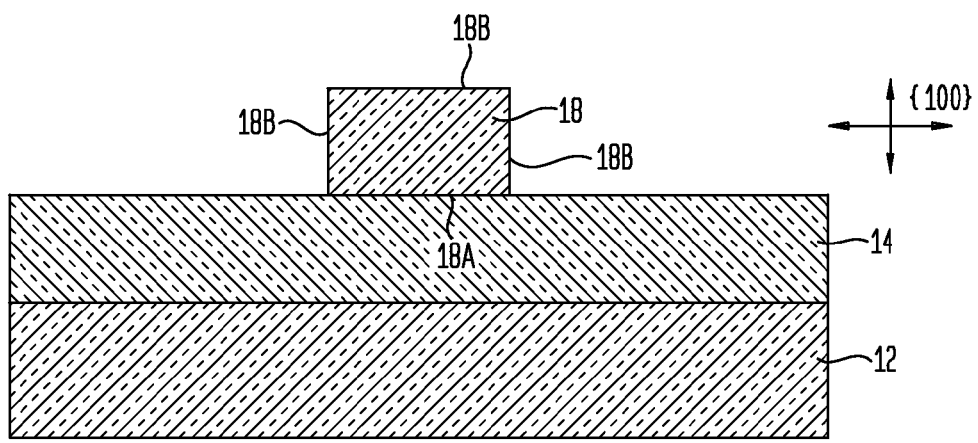

The semiconductor device layer 16 is then patterned to form at least one 3D precursory semiconductor structure 18, which has a rectangular cross-section with a bottom surface 18A and multiple additional surfaces 18B all oriented along the {100} planes of silicon, as shown in FIG. 6. Preferably, the 3D precursory semiconductor structure 18 is formed by an anisotropic etching process that etches the semiconductor device layer 16 along a direction that is perpendicular to the substrate surface (i.e., straight into the substrate).

Figure 7:
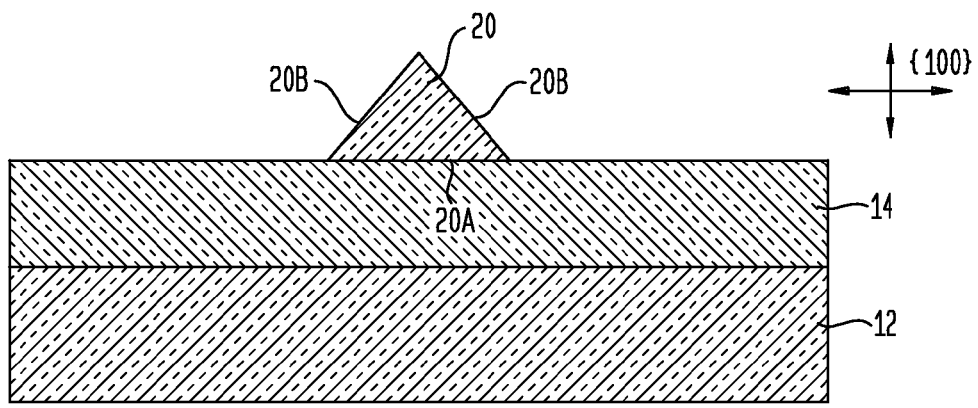

Subsequently, a preferential crystallographic etching is carried out to convert the 3D precursory semiconductor structure 18 into a 3D semiconductor structure 20, which has a triangular cross-section with a bottom surface 20A and multiple additional surfaces 20B, as shown in FIG. 7. Specifically, the bottoms surface 20A of the 3D semiconductor structure 20 is oriented along one of the {100} planes of silicon, but the additional surfaces 20B are oriented along the {110} planes of silicon and are offset from the {100} planes of silicon by a 45° angle.

The term "preferential crystallographic etching" as used herein refers to an etching process that etches a single crystal semiconductor structure along all directions, but along a first set of equivalent crystal planes at a rate faster than that along a second, different set of equivalent crystal planes. In the specific embodiment shown in FIG. 7, the preferential crystallographic etching step etches the 3D precursory semiconductor structure 18 along all directions, but along the {100} planes at a rate faster than that along the {110} planes and therefore terminates at the {110} planes.

The anisotropic and preferential crystallographic etching processes as mentioned hereinabove can be carried out by any suitable dry and/or wet etching techniques known in the art.

Preferably, but not necessarily, the anisotropic etching of the semiconductor substrate can be carried out by one or more dry-etching processes, such as reactive ion etching, sputter etching, vapor phase etching, ion beam etching, plasma etching, and laser ablation. The dry-etching processes are directional, but they are mostly non-selective to different crystal planes or orientations, i.e., they etch the semiconductor substrate in approximately equal rates along all directions. In a particularly preferred embodiment of the present invention, the dry-etching is carried out using a reactive ion etching (RIE) process.

Preferential crystallographic etching of the semiconductor structure is preferably carried out by one or more wet-etching processes, which employ etching solutions such as hydroxide-based etching solutions, ethylene diamine pyrocatechol (EDP)-based etching solutions, etc. These wet-etching processes typically etch the semiconductor structure along all directions, but with a preferential crystallographic selectivity, i.e., at significantly different etching rates along different crystal planes or orientations (which are referred to herein as "preferential crystallographic etching"). Therefore, the etch pattern formed by a preferential crystallographic etching process proceeds along the fast-etched crystal planes and is eventually terminated by the slowly-etched crystal planes.

For example, an etching solution that comprises approximately 23.4% KOH, 13.3% isopropyl alcohol (IPA), and 63.3% water, when heated to about 80° C., etches the single crystal silicon at an etching rate of about 1.0 μm/minute along the {100} planes, but at an etching rate of about 0.06 μm/minute along the {110} planes. In other words, this etching solution etches the {100} planes about 17 times faster than the {110} planes. Therefore, such an etching solution can be used to etch a silicon substrate to form a recess that is terminated at the {110} planes.

In contrast, an etching solution that comprises approximately 44% KOH and 56% water, when heated to about 120° C., etches the single crystal silicon at an etching rate of about 11.7 μm/minute along the {110} planes, about 5.8 μm/minute along the {100} planes, and about 0.02 μm/minute along the {111} planes. In other words, this etching solution etches the {110} and {100} planes significantly faster than the {111} planes (more than 550 and 250 times faster, respectively). Therefore, such an etching solution can be used to etch a silicon substrate to form a recess that is terminated at the {111} planes.

Note that although dry-etching is typically used for anisotropic etching, certain dry-etching techniques, such as RIE, can also be used for preferential crystallographic etching. In RIE, the substrate is placed inside a reactor in which several gases are introduced. A plasma is introduced in the gas mixture using an radio-frequency (RF) power source, breaking the gas molecules into ions. The ions are accelerated towards, and react at, the surface of the material being etched, forming another gaseous material. This is known as the chemical part of reactive ion etching, which can be crystallographic, i.e., with crystallographic selectivity along different crystal planes or directions. The RIE also has a physical aspect: if the ions have high enough energy, the ions can knock atoms out of the material to be etched without a chemical reaction. The physical etching aspect of RIE is highly anisotropic, but without preferential crystallographic selectivity. Therefore, RIE is a complex process that involves both chemical and physical etching. By carefully adjusting the chemistry and the balance between the chemical aspect and the physical aspect of RIE, this process can be used to achieve either anisotropic or preferential crystallographic etching results. Similarly, although wet-etching is typically used for preferential crystallographic etching, certain wet-etching chemistries can also be used to achieve anisotropic etching results.

Therefore, the present invention is not limited to the use of dry-etching for the anisotropic etching process and the use of wet-etching for the preferential crystallographic etching process, but encompasses all suitable etching processes and techniques that can be used to achieved the desired anisotropic and preferential crystallographic results as described hereinabove.

Figure 8:
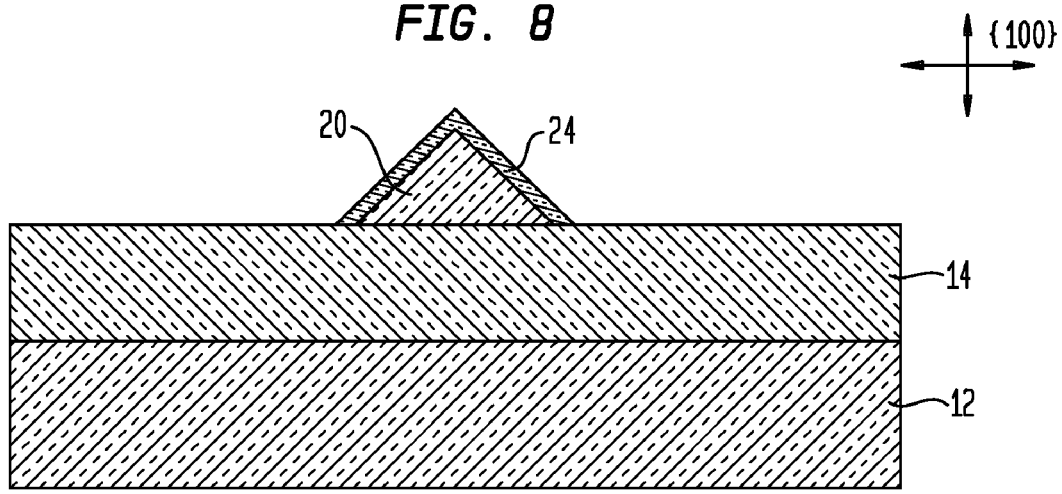
Figure 9A:
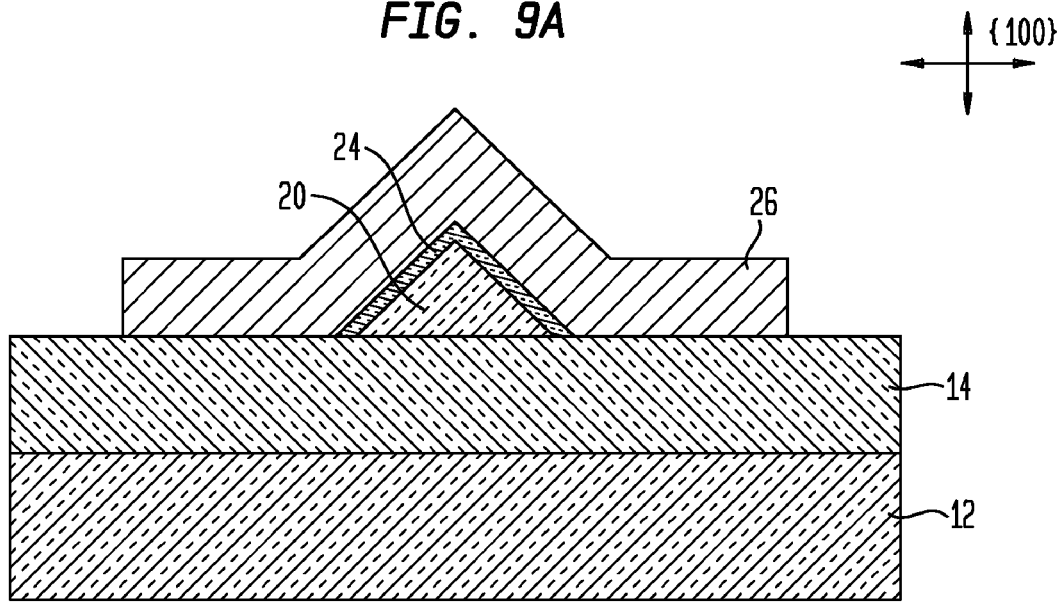
Figure 9B:
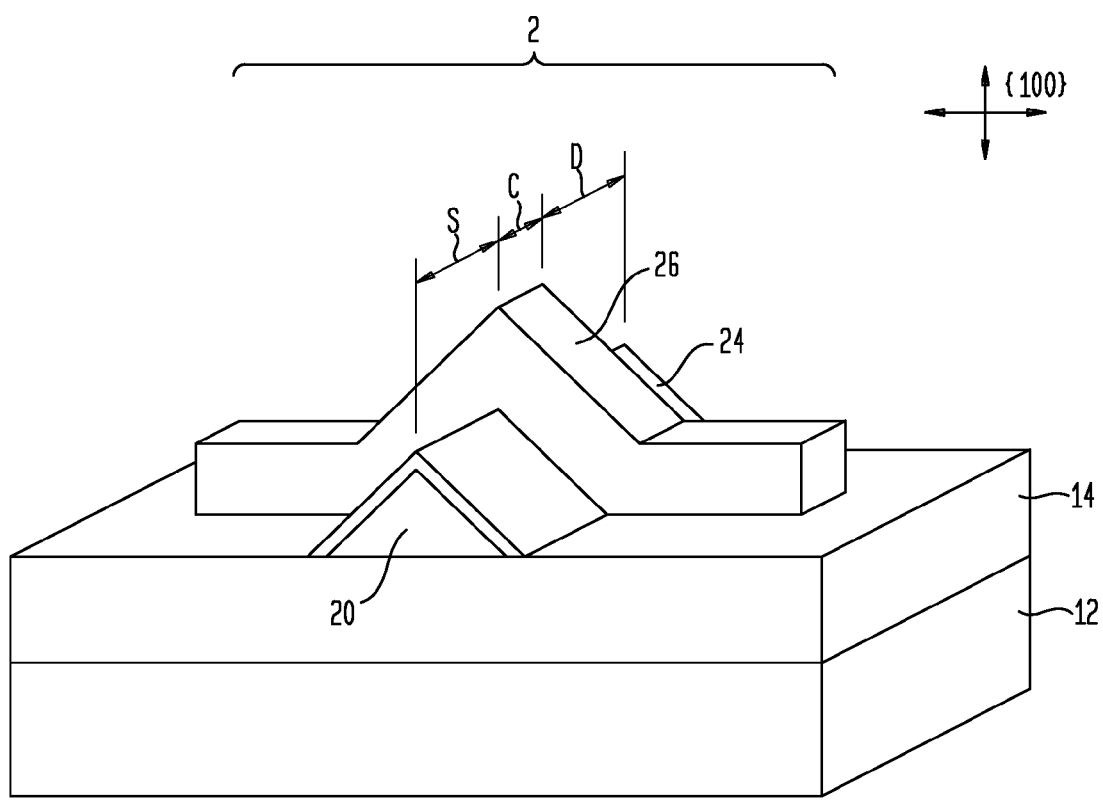

Subsequently, a gate dielectric layer 24 and a gate conductor 26 can be formed over the 3D semiconductor structure 20, as shown in FIGS. 8 and 9A. Therefore, a complete 3D FET device 2 is formed, as shown in FIG. 9B. Specifically, the gate conductor 26, which is located over a portion of the 3D semiconductor structure 20, delineates the channel region C for the 3D FET 2. The source and drain regions S and D are also located in the 3D semiconductor structure 20 but at two sides of the channel region C and outside of the gate conductor 26, as shown in FIG. 9B.

In this manner, carrier channels of the 3D FET device 2 are located in the channel region C and extend along the additional surfaces 20B of the 3D semiconductor structure 20, which are respectively oriented along the {110} planes of silicon that enhance the hole mobility. Therefore, the 3D FET device 2 can be readily doped with p-type implants at its source and drain regions S and D to form a high performance 3D p-FET with {110} channel orientations.

Figure 5:
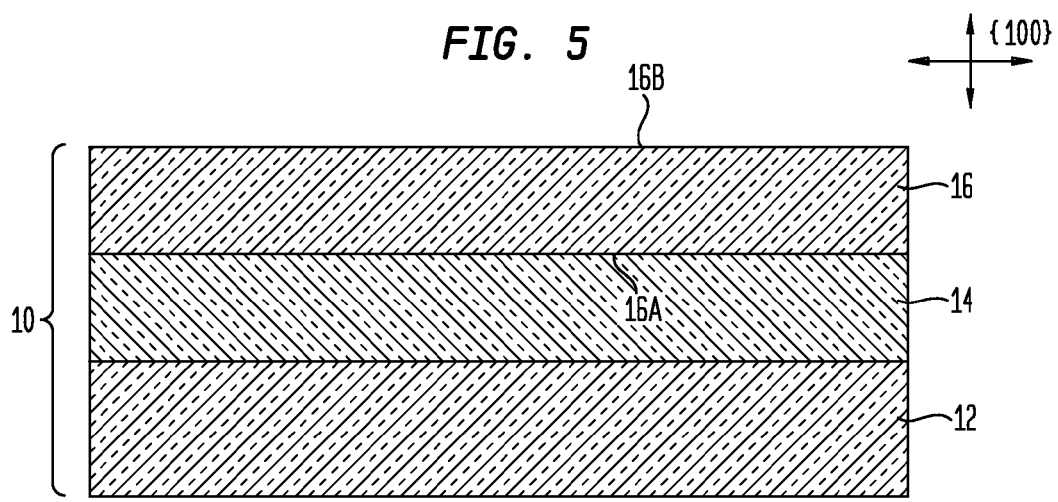
FIGS. 5-9B illustrate exemplary processing steps for fabricating the 3D FET of FIG. 3, according to one embodiment of the present invention.

Although the above-described processing steps of FIGS. 5-7 shows formation of {110} surfaces by preferential crystallographic etching of a semiconductor structure with initial {100} surfaces, it is readily understood that similar processing steps can be used to form {100} surfaces by preferential crystallographic etching of a semiconductor structure with initial {110} surfaces. Specifically, the initial semiconductor device layer 16 can have upper and lower surfaces oriented along the {110} planes of silicon, and a preferential crystallographic etching step that etches the {110} planes at a rate faster than that of the {100} planes and therefore terminates at the {100} planes can be subsequently used to form a 3D semiconductor structure with a bottom surface oriented along one of the {110} planes but with additional surfaces oriented along the {100} planes. Such a 3D semiconductor structure can be used to form a high performance 3D n-FET with {100} channel orientations (not shown).

Figure 10:
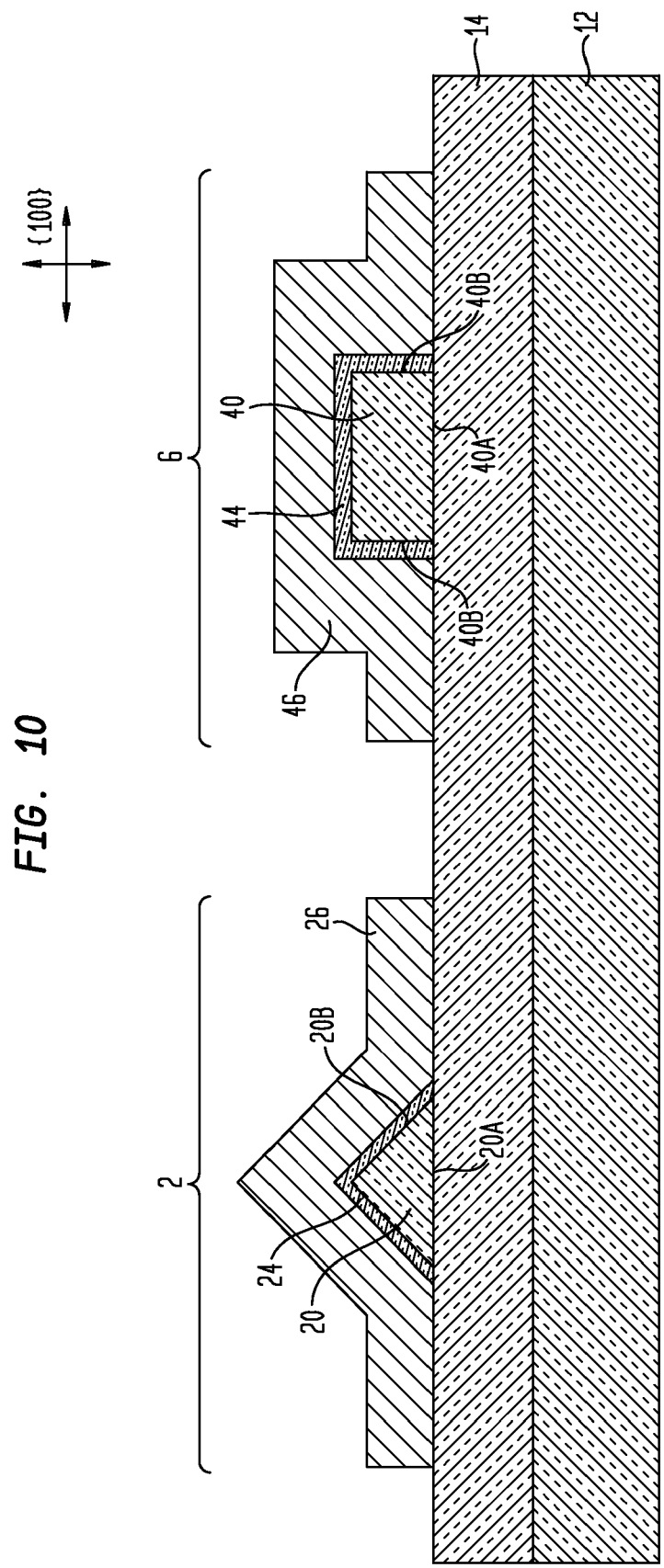
FIG. 10 shows a cross-sectional view of a CMOS structure comprising the 3D FET 2 of FIG. 3 and an additional 3D FET 6, which is located over the same substrate but having different channel orientations from the 3D FET 2, according to one embodiment of the present invention.

FIG. 10 shows a cross-sectional view of a CMOS structure comprising the 3D FET 2 of FIG. 3 and an additional 3D FET 6, which is located over the same substrate but having different channel orientations from the 3D FET 2, according to one embodiment of the present invention.

Specifically, the additional 3D FET 6 have source, drain and channel regions (not shown) located in a 3D semiconductor structure 40 with a bottom surface 40A and multiple additional surfaces 40B, all oriented along the {100} planes of silicon. A gate stack comprising the gate dielectric 44 and the gate conductor 46 is located over a portion of the 3D semiconductor structure 40 in FIG. 10. This gate stack thereby delineates an PET channel region (not shown in the 3D semiconductor structure 40. Specifically, the FET channel region is located directly underneath this gate stack and between a source region (not shown) and a drain region (not shown) that are also located in the 3D semiconductor structure 40. In this manner, a complete 3D FET device structure 6 is formed, and carrier channels of such a 3D FET 6 are located in the channel region (not shown) in the 3D semiconductor structure 40 directly underneath the gate stack. More specifically, the carrier channels lie on the additional surfaces 40B of the 3D semiconductor structure 40 and therefore are oriented along the {100} crystal planes of silicon, as shown in FIG. 10.

Correspondingly, the 3D FET device structure 6 can be readily implanted with n-type source/drain dopant species to form a high performance 3D n-FET structure, which is complementary to the high performance 3D p-FET structure formed by the 3D FET device structure 2.

The 3D semiconductor structures 20 and 40 as shown in FIG. 10 can be readily formed by patterning the semiconductor device layer 16 of FIG. 5 into at least two precursory 3D semiconductor structures 18, one of which is used to form the 3D semiconductor structure 20 by preferential crystallographic etching while the other is masked during the preferential crystallographic etching and therefore forms the 3D semiconductor structure 40.

In this manner, two 3D semiconductor structures 20 and 40 having different surface orientations are first formed over the same substrate and are then used to form complementary FET devices with different channel orientations.

Figure 11:
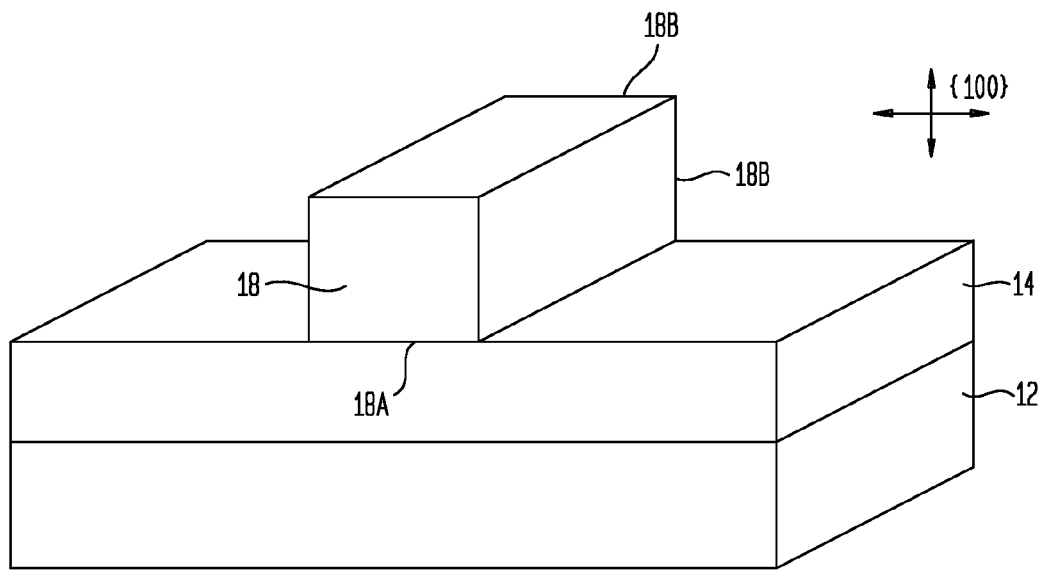
FIG. 11-15 illustrate exemplary processing steps for fabricating the 3D FET 2 of FIG. 4, according to one embodiment of the present invention.

FIG. 11-15 illustrate exemplary processing steps for forming the alternative 3D FET device structure 4 of FIG. 4. At least one 3D precursory semiconductor structure 18 having a rectangular cross-section with a bottom surface 18A and multiple additional surfaces 18B all oriented along the {100} planes of silicon is first formed, as shown in FIG. 11. Preferably, the 3D precursory semiconductor structure 18 is formed by an anisotropic etching process, as mentioned hereinabove.

Figure 12:
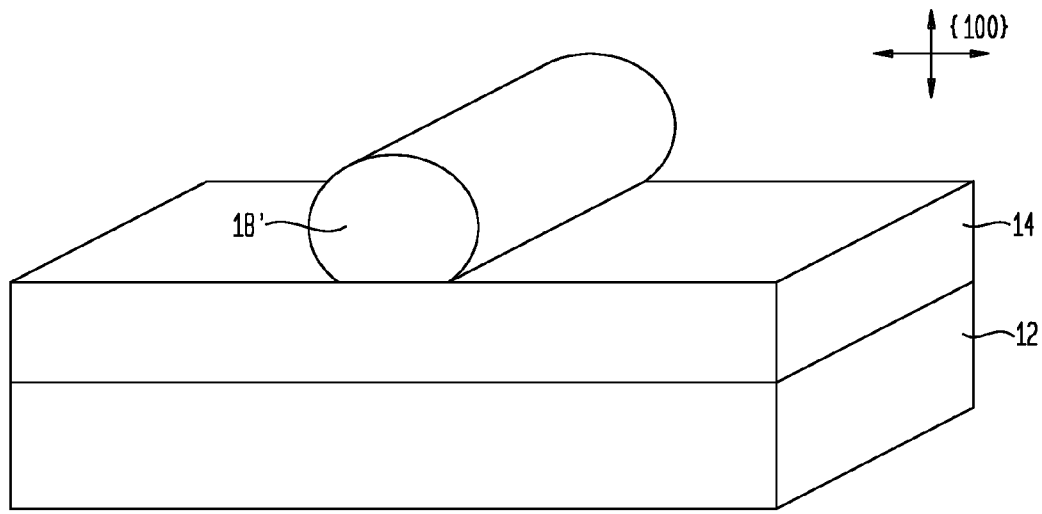

Next, a hydrogen-annealing step is carried out to convert the rectangularly cross-sectional 3D precursory semiconductor structure 18 into a 3D precursor semiconductor structure 18' with a partially circular cross-section, as shown in FIG. 12. The hydrogen-annealing step is preferably carried at a temperature ranging from about 1000° C. to about 1200° C., and more preferably from about 1050° C. to about 1150° C. in a hydrogen gas environment. During the hydrogen annealing, surface atoms of the 3D precursory semiconductor structure 18 migrate to form a new structure having the lowest free energy, i.e., a new 3D precursory semiconductor structure 18' with rounded corners rather than sharp corners.

Figure 13:
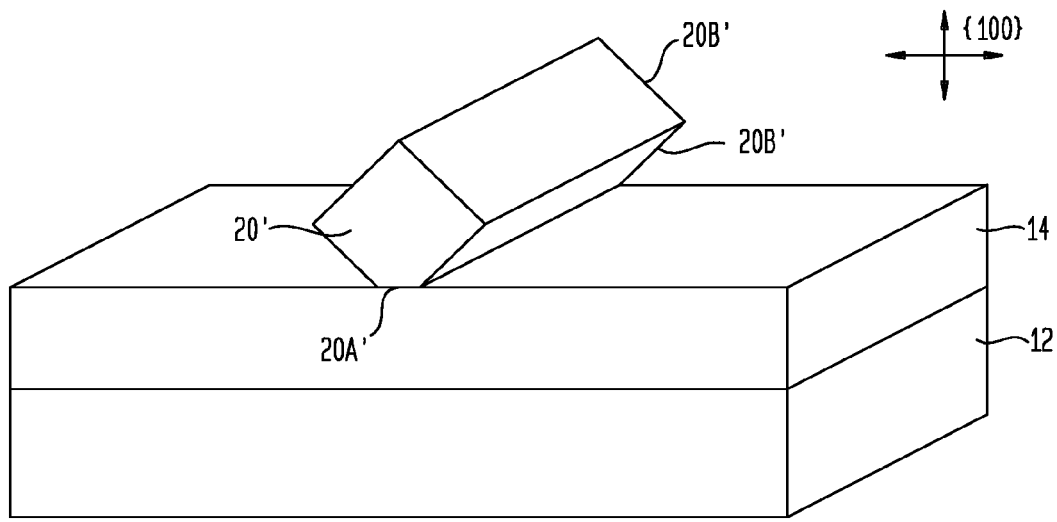

Subsequently, a preferential crystallographic etching is carried out to convert the circularly cross-sectional 3D precursory semiconductor structure 18' into a 3D semiconductor structure 20', which has a pentagonal cross-section with a bottom surface 20A' and multiple additional surfaces 20B', as shown in FIG. 13. Specifically, the bottoms surface 20A' of the 3D semiconductor structure 20' is oriented along one of the {100} planes of silicon, but the additional surfaces 20B' are oriented along the {110} planes of silicon and are offset from the {100} planes of silicon by a 45° angle.

Figure 14:
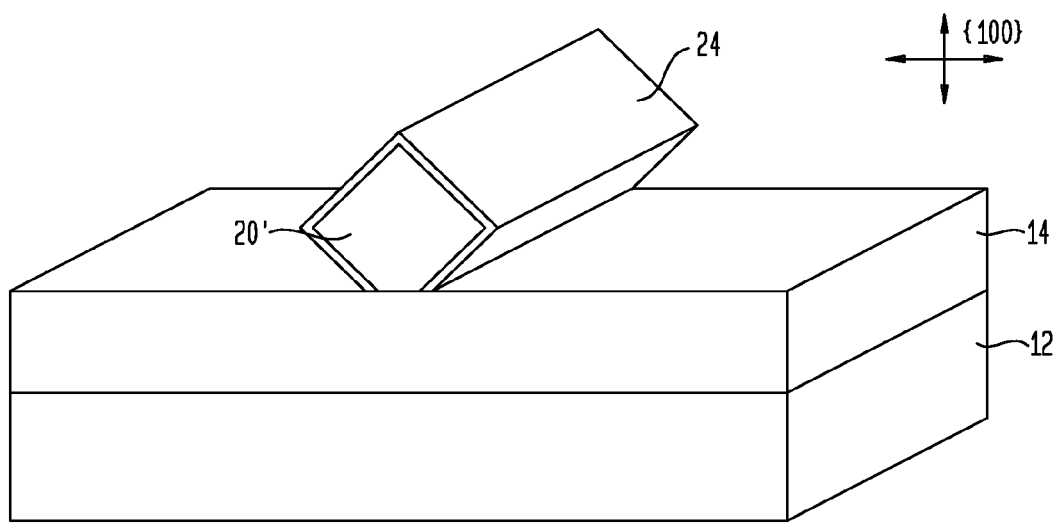
Figure 15:
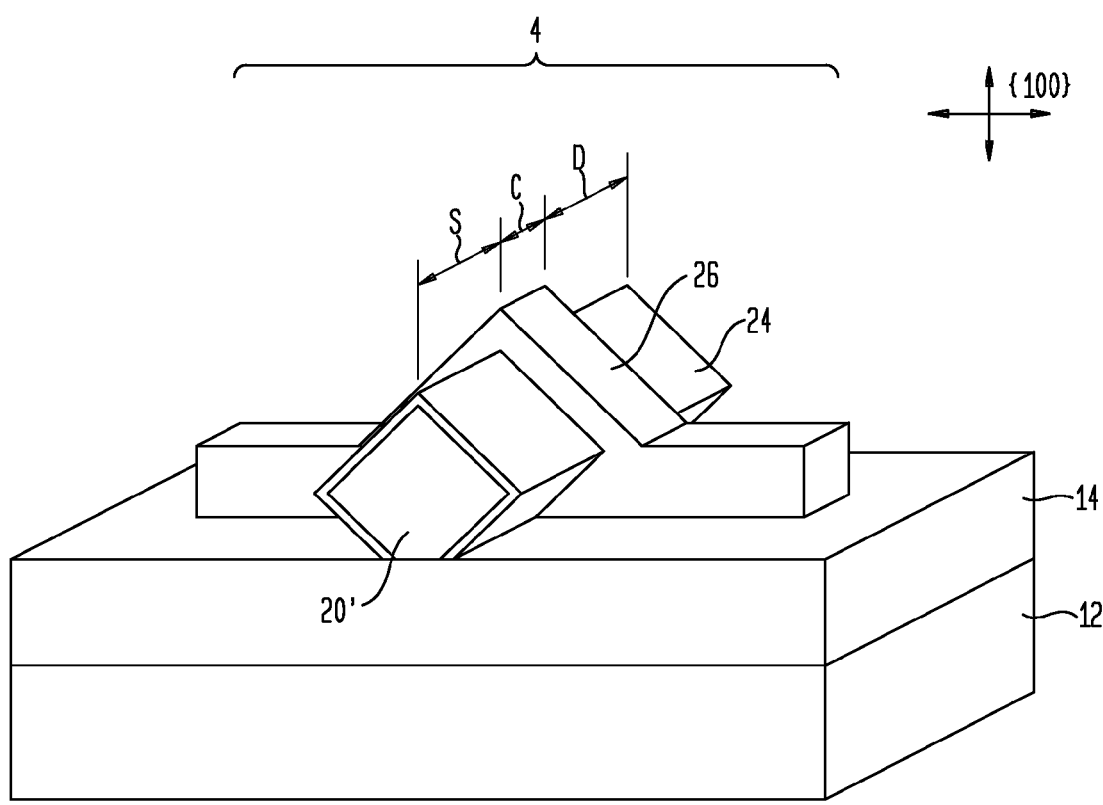

Subsequently, a gate dielectric layer 24 and a gate conductor 26 can be formed over the 3D semiconductor structure 20', as shown in FIGS. 14 and 15. Therefore, a complete 3D FET device 4 is formed, as shown in FIG. 15. Specifically, the gate conductor 26, which is located over a portion of the 3D semiconductor structure 20', delineates the channel region C for the 3D FET 4. The source and drain regions S and D are also located in the 3D semiconductor structure 20' but at two sides of the channel region C and outside of the gate conductor 26, as shown in FIG. 15.

In this manner, carrier channels of the 3D FET device 4 are located in the channel region C and extend along the additional surfaces 20B' of the 3D semiconductor structure 20', which are respectively oriented along the {110} planes of silicon that enhance the hole mobility. Therefore, the 3D FET device 4 can be readily doped with p-type implants at its source and drain regions S and D to form a high performance 3D p-FET with {110} channel orientations.

Figure 16:
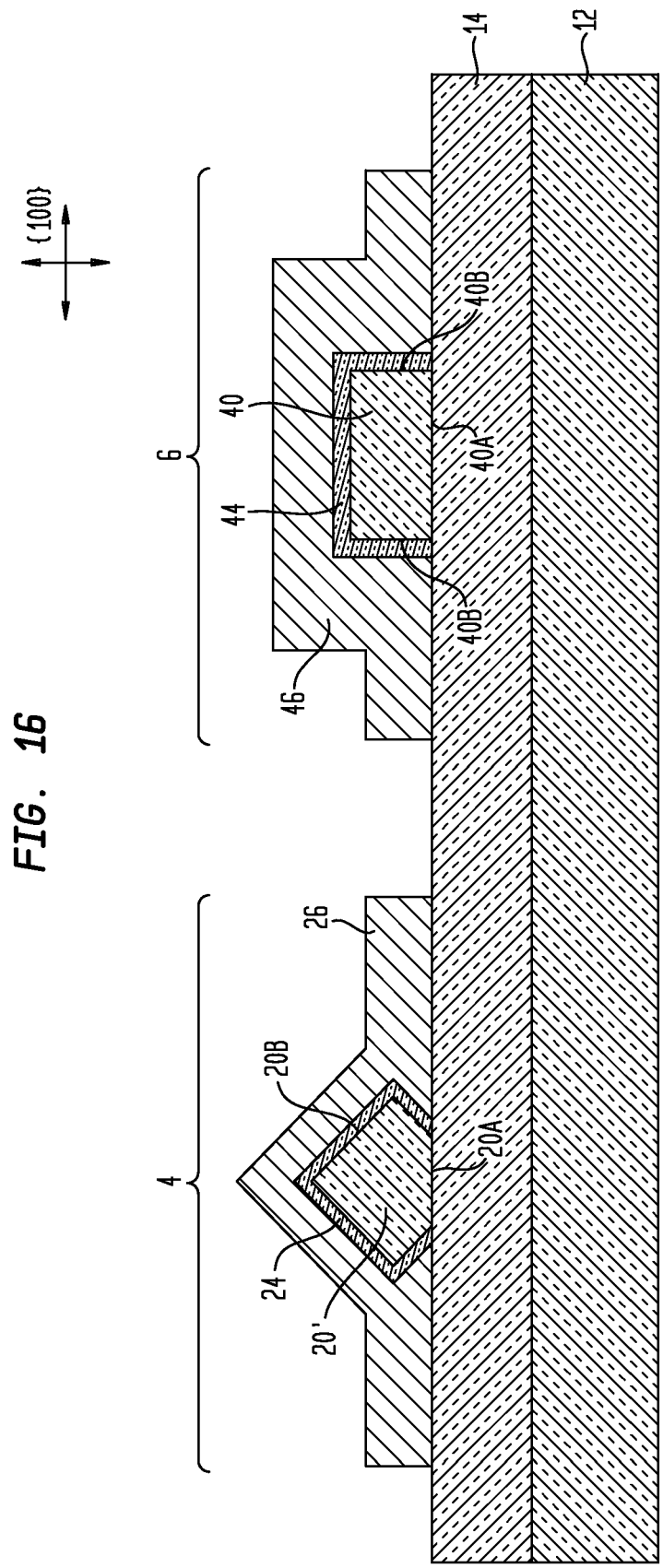
FIG. 16 is a cross-sectional view of a complementary semiconductor device comprising the 3D FET 4 of FIG. 4 and an additional 3D FET, which is located over the same substrate but having different channel orientations from the 3D FET 4, according to one embodiment of the present invention.

FIG. 16 shows a cross-sectional view of a CMOS structure comprising the 3D FET 4 of FIG. 4 and an additional 3D FET 6, which is located over the same substrate but having different channel orientations from the 3D FET 4, according to one embodiment of the present invention.

As mentioned hereinabove, the additional 3D FET 6 have source, drain and channel regions (not shown) located in a 3D semiconductor structure 40 with a bottom surface 40A and multiple additional surfaces 40B, all oriented along the {100} planes of silicon. A gate stack comprising the gate dielectric 44 and the gate conductor 46 is located over a portion of the 3D semiconductor structure 40 and thereby delineates an FET channel region (not shown) in the 3D semiconductor structure 40. Specifically, the FET channel region is located directly underneath this gate stack and between a source region (not shown) and a drain region (not shown) that are also located in the 3D semiconductor structure 40. In this manner, a complete 3D FET device structure 6 is formed, which has carrier channels lying on the additional surfaces 40B of the 3D semiconductor structure 40 and oriented along the {100} crystal planes of silicon, as shown in FIG. 16.

Correspondingly, the 3D FET device structure 6 can be readily implanted with n-type source/drain dopant species to form a high performance 3D n-FET structure, which is complementary to the high performance 3D p-FET structure formed by the 3D FET device structure 4.

The 3D semiconductor structures 20' and 40 as shown in FIG. 16 can be readily formed by patterning the semiconductor device layer 16 of FIG. 5 into at least two precursory 3D semiconductor structures 18, one of which is annealed in a hydrogen environment and then undergoes preferential crystallographic etching to form the 3D semiconductor structure 20', while the other is masked during the hydrogen annealing and the preferential crystallographic etching steps and therefore forms the 3D semiconductor structure 40.

In this manner, two 3D semiconductor structures 20' and 40 having different surface orientations can be first formed over the same substrate and can then be used to form complementary FET devices with different channel orientations.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a semiconductor device, comprising:
    forming a layered substrate comprising at least a base semiconductor substrate layer, an insulator layer over the base semiconductor substrate layer, and a semiconductor device layer over the insulator layer, wherein the semiconductor device layer has upper and lower surfaces oriented along a first set of equivalent crystal planes;
    patterning the semiconductor device layer to provide at least two 3D precursory semiconductor structures, wherein a second 3D precursory semiconductor structure is masked and a first 3D precursory semiconductor structure is exposed; and
    conducting preferential crystallographic etching of the first 3D precursory semiconductor structures, wherein said first 3D precursory semiconductor structure is etched along the first set of equivalent crystal planes at a rate faster than that along a second, different set of equivalent crystal planes, thereby forming the first 3D semiconductor structure having the bottom surface and the multiple additional surfaces, wherein the bottom surface of the first 3D semiconductor structure is oriented along one of the first set of equivalent crystal planes, and wherein the multiple additional surfaces of the first 3D semiconductor structure are oriented along the second, different set of equivalent crystal planes.

2. The method of claim 1, wherein the semiconductor device layer is patterned by anisotropic etching that etches the semiconductor device layer along a direction that is perpendicular to its upper surface, and the at least two 3D precursory semiconductor structures each has a rectangular cross-section.

3. The method of claim 2, wherein the anisotropic etching is carried out using a dry-etching step, and the preferential crystallographic etching is carried out using a wet-etching step.

4. The method of claim 3, wherein reactive ions are used in the dry-etching step, and a hydroxide-based etching solution is used in the wet-etching step.

5. The method of claim 2, wherein the first 3D semiconductor structure formed by the preferential crystallographic etching has a triangular cross-section.

6. The method of claim 2, wherein the at least one 3D precursory semiconductor structure is treated by hydrogen annealing before the preferential crystallographic etching, and the first 3D semiconductor structure formed by the preferential crystallographic etching has a pentagonal cross-section.

7. The method of claim 1, wherein the semiconductor device layer comprises single crystal silicon, and the first and second sets of equivalent crystal planes are selected from the group consisting of the {100}, {110}, and {111} planes of silicon.

8. The method of claim 1, further comprising forming a gate stack over at least a portion of the first 3D semiconductor structure, thereby forming a first 3D FET having a channel region located in the first 3D semiconductor structure under the gate stack and a source region and a drain region also located in the first 3D semiconductor structure but at two sides of the channel region.

9. The method of claim 1, the first 3D precursory semiconductor structure is preferentially etched, and the second 3D precursory semiconductor structure is not etched and has a bottom surface and multiple additional surfaces all oriented along the first set of equivalent crystal planes.

10. The method of claim 9, wherein the first 3D semiconductor structure has a triangular or a pentagonal cross-section, and the second 3D semiconductor structure has a rectangular cross-section.

11. The method of claim 9, wherein the first and second 3D semiconductor structures both comprise single crystal silicon, and the first and second sets of equivalent crystal planes are selected from the group consisting of the {100}, {110}, and {111} planes of silicon.

12. The method of claim 9, wherein the first 3D semiconductor structure forms a first 3D FET having a first conductivity type and with carrier channels oriented along the second, different set of equivalent crystal planes, and the second 3D semiconductor structure forms a second 3D FET having a second conductivity type and with cater channels oriented along the first set of equivalent crystal planes.

13. The method of claim 12, wherein the first 3D FET has p-type conductivity and the second 3D FET has n-type conductivity, the first and second 3D semiconductor structures both comprise single crystal silicon, the first set of equivalent crystal planes are the {100} planes of silicon, and the second, different set of equivalent crystal planes are the {110} planes of silicon.

14. The method of claim 12, wherein the first 3D FET has n-type conductivity and the second 3D FET has p-type conductivity, the first and second 3D semiconductor structures both comprise single crystal silicon, the first set of equivalent crystal planes are the {110} planes of silicon, and the second, different set of equivalent crystal planes are the {100} planes of silicon.

* * * * *